US011174153B2

(12) United States Patent
Gurin et al.

(10) Patent No.: US 11,174,153 B2
(45) Date of Patent: Nov. 16, 2021

(54) PACKAGE LEVEL THERMAL GRADIENT SENSING

(71) Applicant: INVENSENSE, INC., San Jose, CA (US)

(72) Inventors: Ilya Gurin, Mountain View, CA (US); Matthew Julian Thompson, Beaverton, OR (US); Vadim Tsinker, Belmont, CA (US)

(73) Assignee: INVENSENSE, INC., San Jose, CA (US)

( * ) Notice: Subject to any disclaimer, the term of this patent is extended or adjusted under 35 U.S.C. 154(b) by 8 days.

(21) Appl. No.: 16/547,275

(22) Filed: Aug. 21, 2019

(65) Prior Publication Data
US 2021/0053820 A1 Feb. 25, 2021

(51) Int. Cl.
*B81B 7/00* (2006.01)

(52) U.S. Cl.
CPC .......... *B81B 7/0087* (2013.01); *B81B 7/0064* (2013.01); *B81B 2201/0235* (2013.01); *B81B 2201/0242* (2013.01); *B81B 2201/0257* (2013.01); *B81B 2201/0264* (2013.01); *B81B 2201/0292* (2013.01)

(58) Field of Classification Search
CPC ................ B81B 7/0087; B81B 7/0064; B81B 201/0235; B81B 2201/0242; B81B 2201/0257; B81B 2201/0264; B81B 2201/0292
See application file for complete search history.

(56) References Cited

U.S. PATENT DOCUMENTS

| | | | |
|---|---|---|---|
| 6,959,583 B2 | 11/2005 | Platt | |
| 8,358,296 B2 | 1/2013 | Anderson | |
| 9,191,012 B2 | 11/2015 | Hsieh | |
| 9,429,491 B2 | 8/2016 | Bemis | |
| 9,523,619 B2 | 12/2016 | DeRosa | |
| 10,024,880 B2 | 7/2018 | Stoops | |
| 10,060,803 B2 | 8/2018 | Nakagawa | |
| 2005/0152015 A1 | 7/2005 | Anderson | |
| 2009/0084177 A1* | 4/2009 | Ao | G01F 1/6845 73/170.12 |
| 2010/0078753 A1* | 4/2010 | Mehregany | G01F 1/6888 257/467 |
| 2013/0085699 A1 | 4/2013 | Touchberry | |
| 2013/0186171 A1 | 7/2013 | Merrill | |
| 2014/0208823 A1 | 7/2014 | Trusov | |

(Continued)

OTHER PUBLICATIONS

International Search Report and Opinion for PCT/US2020/043573 dated Nov. 2, 2020 (13 pages).

*Primary Examiner* — Zandra V Smith
*Assistant Examiner* — Andre C Stevenson
(74) *Attorney, Agent, or Firm* — Haley Guiliano LLP; Joshua V. Van Hoven; Stefan D. Osterbur

(57) ABSTRACT

A microelectromechanical (MEMS) device may be coupled to a dielectric material at an upper planar surface or lower planar surface of the MEMS device. One or more temperature sensors may be attached to the dielectric material layer. Signals from the one or more temperature sensors may be used to determine a thermal gradient along on axis that is normal to the upper planar surface and the lower planar surface. The thermal gradient may be used to compensate for values measured by the MEMS device.

25 Claims, 11 Drawing Sheets

(56) References Cited

U.S. PATENT DOCUMENTS

| | | | |
|---|---|---|---|
| 2014/0250969 A1* | 9/2014 | Alagarsamy | B81C 99/005 73/1.01 |
| 2017/0343443 A1 | 11/2017 | VanDeWeert | |
| 2018/0038921 A1 | 2/2018 | Parsa | |
| 2018/0283956 A1 | 10/2018 | Van Buggenhout | |
| 2019/0165759 A1 | 5/2019 | Nishizawa | |
| 2020/0049539 A1 | 2/2020 | De Luca | |

* cited by examiner

PACKAGE LEVEL THERMAL GRADIENT SENSING

BACKGROUND

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical (MEMS) devices or sensors such as accelerometers and gyroscopes capture complex movements and determine orientation or direction. For example, smartphones are equipped with accelerometers and gyroscopes to augment navigation systems that rely on Global Position System (GPS) information. In another example, an aircraft determines orientation based on gyroscope measurements (e.g., roll, pitch, and yaw) and vehicles implement assisted driving to improve safety (e.g., to recognize skid or roll-over conditions).

Each of the end-use products of MEMS devices involves placement adjacent to other electronic components, such as displays, processors, memory, antennas, and touchscreens. With the proliferation of MEMS devices in scores of different device types by different manufactures, heat transfer from adjacent components can be unpredictable as to the amount of heat transferred from other components, the duration and pattern of the heat transfer, and the locations where heat is transferred to the MEMS device. Furthermore, these numerous different types of devices are used in scores of end-use applications ranging from simple consumer electronics to industrial environments and vehicles, further exacerbating the numerous heat transfer profiles that MEMS devices may endure during operation. The heat transfer profiles include non-uniform temperature at different portions of the MEMS device. These thermal gradients in a MEMS device can cause motion of the MEMS structures (proof masses), separate from the motion caused by uniform change of temperature. This motion may manifest in sensor performance, for example, as a change of offset or sensitivity.

SUMMARY

In an embodiment of the present disclosure, a system for identifying a thermal gradient within a device comprises a microelectromechanical (MEMS) device comprising a plurality of layers, a cavity within the plurality of layers, wherein one or more microelectromechanical components are movable within the cavity in response to an external force, and a planar surface of the MEMS device, and a dielectric material layer coupled to the planar surface. The system further comprises a plurality of temperature sensors, at least one of which is attached to the dielectric material layer. The system may further comprise processing circuitry configured to receive a signal from the plurality of temperature sensors and output a response signal representative of the thermal gradient along an axis that is normal to the planar surface of the MEMS device.

In an embodiment of the present disclosure, a method for identifying a thermal gradient within a device comprises receiving, at processing circuitry, a signal from a plurality of temperature sensors, wherein at least one of the plurality of temperature sensors is attached to a dielectric material layer, and wherein the dielectric material layer is coupled to a top planar surface of a microelectromechanical (MEMS) device or a bottom planar surface of the MEMS device. The method may further comprise determining, by the processing circuity, a thermal gradient along an axis that is normal to the top planar surface and the bottom planar surface based on a respective signal from each of the plurality of temperature sensors.

In an embodiment of the present disclosure, a packaged microelectromechanical (MEMS) device may comprise a MEMS device, comprising a plurality of layers, a cavity within the plurality of layers, wherein one or more microelectromechanical components are movable within the cavity in response to an external force, and a planar surface of the MEMS device. The packaged MEMS device may further comprise a dielectric material layer coupled to the planar surface and a plurality of temperature sensors, at least one of which is attached to the dielectric material layer.

BRIEF DESCRIPTION OF THE DRAWINGS

The above and other features of the present disclosure, its nature, and various advantages will be more apparent upon consideration of the following detailed description, taken in conjunction with the accompanying drawings in which.

DETAILED DESCRIPTION OF DRAWINGS

Figure 1:
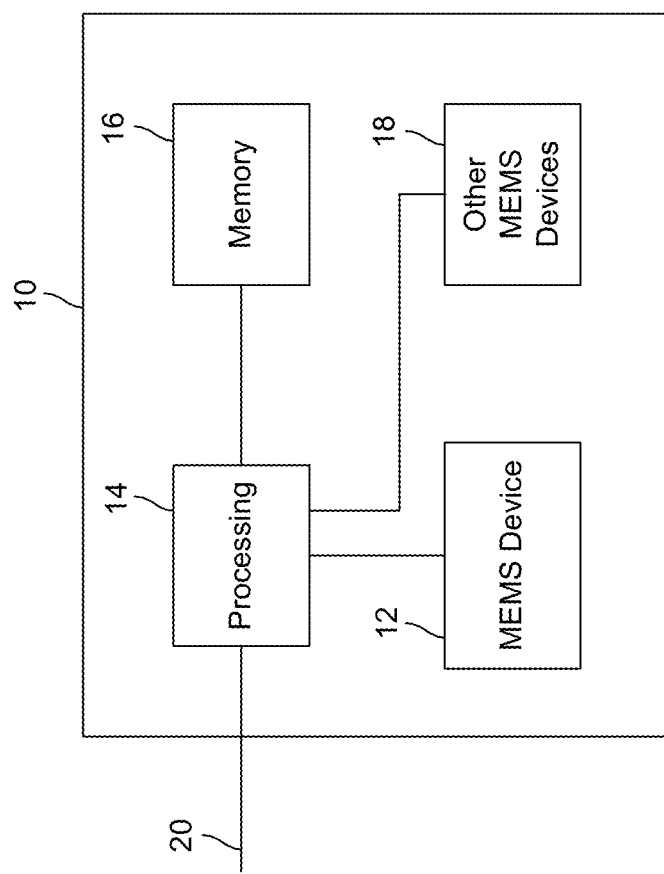
FIG. 1 depicts an exemplary motion sensing system in accordance with some embodiments of the present disclosure.

An exemplary MEMS device may have a plurality of layers that are fabricated, patterned, and bonded together. A MEMS layer may be bonded between other layers (e.g., an upper or cap layer and a lower or substrate layer) and may include one or more micromechanical components that may move in response to particular stimuli that are applied to the MEMS device. Electrical circuitry of the MEMS device may interact with the micromechanical components to output signals of interest. For example, MEMS inertial sensors may include a suspended spring-mass system that is designed such that portions of the suspended spring-mass system (e.g., proof masses suspended within the suspended spring-mass system) move in a particular manner in response to particular applied inertial forces, such as linear acceleration along a measurement axis or angular velocity about a measurement axis. For another example, a pressure sensor may have a cavity that is hermetically sealed adjacent to one portion of the MEMS layer and another cavity that receives a gas at another portion of the MEMS layer, resulting in movement of the MEMS layer based on the relative pressures and MEMS layer design. Other devices that can be fabricated using MEMS techniques include magnetometers and ultrasonic sensors, although there are many devices such as sensors and actuators that can be fabricated using MEMS techniques.

Because MEMS devices may be extremely small, they are used in numerous electronic devices, often in proximity to components that are significant heat sources, or in end-use applications where the environment includes significant heat sources. As a result, MEMS devices may be subject to a variety of heat transfer conditions, including relative location of exposure, time of exposure, rate of change over time, etc. As a result, a MEMS device may not be at a uniform temperature and may instead experience complex thermal gradients throughout the device as a whole. These thermal gradients may also be impacted by the design of the MEMS device itself, including the materials of the respective layers, bonding materials between layers, configuration of bonding locations in which heat may transfer between layers, intra-layer design such as MEMS layer design, and locations and density of electrical components (e.g., within a CMOS substrate layer).

The thermal gradients may cause complex changes to the operation of the sensor, for example, by causing components within the MEMS layer to expand or contract, modifying clearances between movable components, changing operating parameters of electrical components, and creating pressure differentials within the cavity of the MEMS device. Because the thermal gradient may not be at a steady state, these effects may be experienced differently by similar electrical and mechanical components at different relative locations within the sensor. Thermal gradients may result in Knudsen forces at boundaries where particles are transferring energy therebetween, resulting in forces imparted on mechanical components such as proof masses. All of these changes due to thermal gradients may impact MEMS devices and components in complex ways, and may degrade the precision and accuracy of the MEMS device.

One or more of the layers of the MEMS device (e.g., a CMOS substrate layer) may be connected to a dielectric material layer. In an embodiment, the dielectric material may be integrated with the MEMS device and fabricated in a wafer process. Representative examples of such dielectric materials include silicon dioxide, silicon nitride, and photoresist. In another embodiment, the dielectric material may be formed in a packaging process. Representative examples of such dielectric materials include die attach film (DAF), epoxy, silicone (e.g., room-temperature vulcanized silicone [RTV]), and soldermask. A dielectric material formed in a packaging process may be part of, or couple to, a packaging substrate (such as a land-grid array or leadframe) that provides physical support for the MEMS device and that facilitates physical and/or electrical connection to other components within the electronic device that includes the MEMS device. A MEMS package may include a MEMS device, dielectric material layer, and a packaging substrate, as described, as well as other structures such as molding compound, a lid forming an open cavity, solder balls or joints, wirebonds, etc. Thus, a MEMS package may physically or electrically attach to other components within the electronic device via the dielectric material layers, which may include physical coupling to external heat sources.

Temperatures sensors may be located on or within the dielectric material layer, for example, as patterned thermally sensitive resistors located at particular locations within a lateral x-y plane of the dielectric material layer (e.g., to capture information about particular thermal gradients and heat transfer patterns) and at a vertical z-axis depth of the dielectric material layer (e.g., at a surface that attaches to the MEMS device, within one or more layers of the dielectric material layer, or on a surface that is not attached to the MEMS device). Multiple temperature sensors may be located at different lateral and vertical locations within the dielectric material layer, and in some embodiments, dielectric material layers including temperature sensors may attach to different surfaces of the MEMS device, such as at an upper surface of a cap layer and at a bottom surface of a CMOS layer. This attachment to multiple surfaces may be performed by multiple dielectric material layers (e.g., a first dielectric material attached to the upper surface of the cap layer and a second dielectric material attached to the bottom surface of a CMOS layer), a single dielectric material layer (e.g., that is rigid or flexibly extends between the top surface of the cap layer and the bottom surface of the MEMS layer), or a combination thereof. In some embodiments, temperature sensors may also be included within the MEMS device. In some embodiments, temperature sensors may also be attached to or included within the packaging substrate.

Heat energy is applied to the MEMS device externally at particular locations along the periphery of the MEMS device, such as the top (e.g., along a top of the cap layer), sides (e.g., for a four-sided sensor, any of four sides of the cap layer, MEMS layer, or CMOS layer, depending on the location of the heat source), or bottom (e.g., along the bottom of the CMOS layer via the packaging substrate and/or dielectric material layer). These may be locations where heat is likely transferred due to exposure to the external environment, circuit boards, or other electronic components. By placing temperature sensors at different locations relative to these edges within dielectric material layer, and in some embodiments within different planes or within layers of the MEMS device, the locations of heat sources as well as patterns of heat transfer may be identified. Heat energy is also applied to the MEMS device internally, as a result of power consumption within the circuits of the MEMS device itself.

Different types of thermal gradients may be identified based on temperature sensor type and placement within the dielectric material layer or layers and within the MEMS device. For example, temperature sensors may be located at different vertical (e.g., z-axis) locations within a MEMS package, such as at different z-axis depths within a dielectric material layer, within layers of the MEMS device, and in other dielectric material layers located at different z-axis locations (e.g., at a cap layer and a CMOS layer). Temperature sensors may similarly be located at different lateral (e.g., x-y plane) locations within the MEMS chip. Information about thermal gradients may be determined from temperature data collected from a single sensor (e.g., current temperature, rate of change of temperature, temperature patterns, etc.) and combinations of sensors (e.g., direction of heat transfer, intensity of heat source, type of heat source, spatial distribution of heat source, etc.).

Once thermal ingredients are identified, the information about the thermal gradients may be utilized to improve the operation of the MEMS device. In some embodiments, adjustments may be made to measured values, such as by changing compensation codes, scaling values, additive compensation values, offset values, sensor output values, A/D conversion thresholds, amplifier inputs, and the like. Changes may also be made to the operation of the MEMS device, such as amplitude, phase or frequency of applied signals to the MEMS layer or electrical components of the MEMS device. Identification of thermal gradients may also be used to impact the operation of other devices, such as by sending alarms or warnings that may be used to adjust the operation of other electrical components that are adjacent to the MEMS device, or to provide warnings to another system such as that measurements may have lower accuracy or to allow the device to cool. Because of the ability of the temperature sensing system described herein to identify and pinpoint complex thermal gradients, the compensation or change in operation may be tailored to the specific type and intensity of the thermal gradient.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS device 12 and supporting circuitry, such as processing circuitry 14 and memory 16. In some embodiments, one or more other MEMS devices 18 (e.g., MEMS gyroscopes, MEMS accelerometers, MEMS microphones, MEMS pressure sensors, and a magnetometer) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of a MEMS device 12 or other MEMS device 18, or on an adjacent portion of a chip to the MEMS gyroscope 12 or other MEMS device 18) to control the operation of the MEMS device 12 or other MEMS devices 18 and perform aspects of processing for the MEMS device 12 or other MEMS devices 18. In some embodiments, processing circuitry 14 may also include a processor such as a microprocessor that executes software instructions, e.g., that are stored in memory 16. The microprocessor may control the operation of the MEMS device 12 by interacting with the hardware control logic, and process signals received from MEMS device 12. The microprocessor may interact with other MEMS devices in a similar manner.

Although in some embodiments (not depicted in FIG. 1), the MEMS device 12 or other MEMS devices 18 may communicate directly with external circuitry (e.g., via a serial bus or direct connection to sensor outputs and control inputs), in an embodiment the processing circuitry 14 may process data received from the MEMS device 12 and other MEMS devices 18 and communicate with external components via a communication interface 20. The processing circuitry 14 may convert signals received from the MEMS device 12 and other MEMS devices 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple MEMS devices, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

Figure 2:
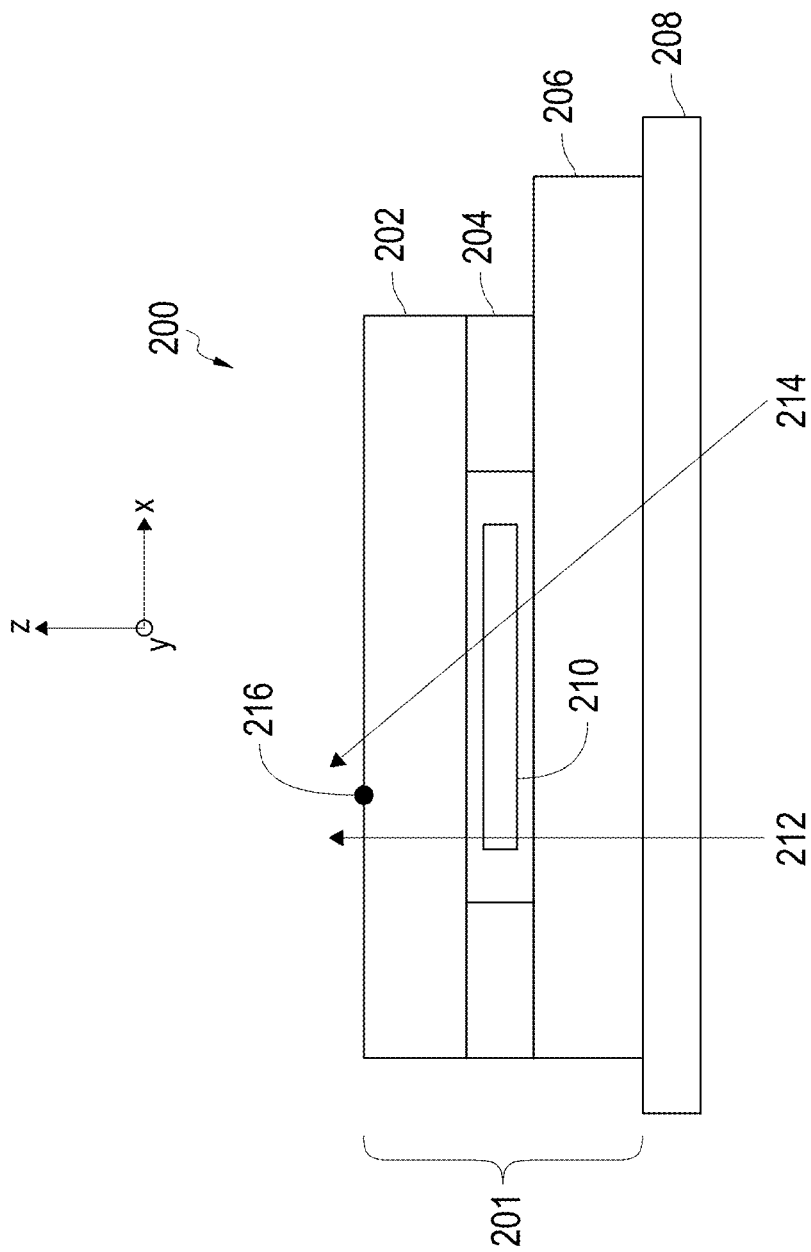
FIG. 2 depicts an exemplary MEMS package including thermal gradients in some embodiments of the present disclosure.

Referring now to FIG. 2, MEMS package 200 includes a MEMS device 201, which may correspond to any of MEMS device 12 or other MEMS devices 18. An exemplary MEMS device 201 may be attached to one or more packaging layers 208, for example, at a top surface of a cap layer and/or a bottom surface of a substrate layer of the MEMS device, although attachment to a packaging layer may occur at different locations of the MEMS device, such as to multiple layers of the MEMS device. A packaging layer as described herein may be any suitable substrate (such as a printed wiring board) or metal-dielectric composite (e.g., leadframe) that performs the necessary functions of the packaging layer, such as facilitating physical and/or electrical connection to other components of the electronic device including the MEMS chip. In some embodiments, those physical and/or electrical connections may provide routes for heat transfer to or from the MEMS chip, for example, at solder, via, and chip pad connections of the packaging layer.

FIG. 2 depicts an exemplary MEMS package 200 including thermal gradients in some embodiments of the present disclosure. Although it will be understood that MEMS packages can include a variety of components and layers in different configurations, in the exemplary embodiment of FIG. 2 the MEMS package 200 may include a MEMS device 201 and a packaging layer 208.

An exemplary MEMS device 201 may include a number of layers, such as a cap layer 202, MEMS layer 204, and substrate layer 206, although it will be understood that a MEMS device may include a variety of different layers or configurations. For example, a MEMS device may contain, besides the layers described above, an additional layer containing electronic circuits. Each of the layers 202, 204 and 206 may be, for example, a silicon die or portion thereof. These layers may be attached to each other by dielectric layers (not depicted). A MEMS layer may include MEMS proof mass 210 to facilitate a particular type of movement in response to a force to be sensed, such as linear acceleration, angular velocity, magnetic field, pressure, etc. The motion of the MEMS proof mass 210 may be sensed by other (e.g., fixed) components within the MEMS layer 204 (not shown) and/or other layers (e.g., cap layer 202 or substrate layer 204). In some embodiments, processing circuitry may be included on one or both of the cap layer 202 and substrate layer 206 (e.g., a CMOS substrate layer) to perform signal processing and calculation of parameters of interest based on the movement of the MEMS proof mass 210.

An exemplary packaging layer 208 may be attached to one or more of the surfaces of the MEMS device 201. Although depicted as attaching to a bottom surface of substrate layer 206 in FIG. 2, it will be understood that the packaging layer 208 may attach to any of the surfaces of the MEMS device 201 and may further attach to multiple of the surfaces of the MEMS device 201. In some embodiments, multiple packaging layers 208 may attach to different portions of the MEMS device. The attachment of the packaging layer(s) 208 to the MEMS device 201 facilitates the physical and/or electrical connection of the MEMS device 201 to other components of the electronic system in which the MEMS device is operating. Although the packaging layer 208 is shown extending outside the lateral bounds of the substrate layer 206, in some embodiments, one or more of the packaging layer(s) 208 may have the same or smaller profile than the substrate layer 206. In some embodiments (not depicted in FIG. 2 or other FIGS. herein) a molding layer or hollow lid may also be applied to surround or substantially cover the MEMS package 200 (e.g., applied over packaging layer 208 and MEMS device 201).

As described herein, a thermal gradient may be experienced within a MEMS device (e.g., MEMS device 201) based on different types and locations of heat sources, creating a number of effects that may alter the output of the MEMS device 201. Heat sources may be located within or directly adjacent to a MEMS device 201, or may be transferred via other components (e.g., via packaging layer 208). The pattern of heat transfer within the MEMS device 201 depends on the nature of the heat source (e.g., point or distributed), the location where the heat is applied, the material properties of the various portions of the MEMS device, the design of the cavity and device components, and other factors as described herein. For simplicity of demonstration, the present discussion will refer to thermal gradients having components along the out-of-plane z-axis and within the x-y plane. However, it will be recognized that in some instances there may be multiple significant heat sources applied at different portions of the MEMS device, leading to a complex temperature distribution with gradients in different directions throughout the MEMS device (e.g., at least until a steady state temperature is reached after a lengthy period of exposure to the multiple significant heat sources).

Returning to FIG. 2, an example of thermal gradients within a MEMS device 201 is further depicted, wherein heat sources 212 and 214 are applied to packaging layer 208 at different locations. The thermal gradients from heat sources 212 and 214 distribute heat throughout the MEMS device 201 based on the relative location and heat transfer path to different portions of the MEMS device 201. For example, with respect to a location 216 on an upper surface of cap 202, heat transfer via thermal gradients from heat sources 212 and 214 may produce a combination of in-plane and out-of-plane thermal gradients, i.e., based on the heat sources themselves and the respective heat transfer paths to location 216 (e.g., via packaging layer 208, substrate layer 206, MEMS layer 204 including a cavity and MEMS proof mass 210, cap layer 202, and bonding layers between these components and layers).

Figure 3:
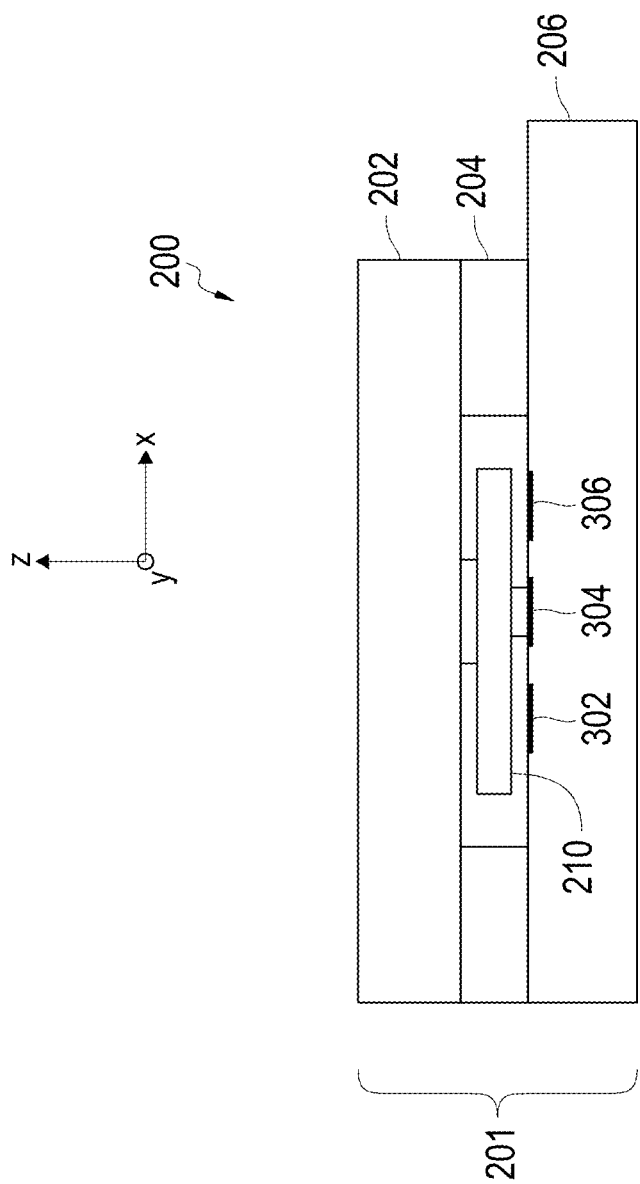
FIG. 3 depicts an exemplary MEMS package including embedded temperature sensors in accordance with some embodiments of the present disclosure.

FIG. 3 depicts an exemplary MEMS device including embedded temperature sensors in accordance with some embodiments of the present disclosure. In some embodiments of the present disclosure, temperature sensors may be located on or within one or more of the layers of the MEMS device. For example, many electronic components such as resistors, thermistors, BJTs, MOSFETs, and thermocouples may have known responses to temperature that can be monitored. In an exemplary embodiment, some of these sensors may be located within a layer of the MEMS device that allows for the creation and monitoring of temperature sensors, such as a CMOS substrate layer 206.

Although it will be understood that any suitable layer having appropriate materials and processes to form electronic components (e.g., the patterning of thermistors, thermocouples, or other components within semiconductor layers) may include temperature sensors, in the exemplary embodiment of FIG. 3 the substrate layer 206 includes multiple planes (i.e., x-y planes) separated in the vertical direction (i.e., z-axis direction) on which electronic components may be formed. In the exemplary embodiment of FIG. 3, temperature sensors 302, 304, and 306 may be located within a common plane of the substrate layer 206, although in other embodiments (not depicted in FIG. 3) additional temperature sensors may be located in other planes of the substrate layer 206 or in other layers of the MEMS device 201 (e.g., cap layer 202, MEMS layer 204, or other layer not depicted).

The temperature sensors may be located at respective locations to capture particular information of interest, such as temperature proximate to regions of interest, such as anchors and bonding points where heat transfer between layers or from external heat sources is likely. In the exemplary embodiment of FIG. 3, the temperature sensors are located in a manner such that a variety of temperature data may be obtained, although it will be understood that different quantities of temperature sensors may be placed at different locations, based on MEMS sensor design (e.g., anchor and proof mass locations, and likely locations of heat sources based on end uses and/or heat-conducting packaging located proximate to one or more of the sides of the MEMS device) and other factors (e.g., types of temperature sensors available and locations suitable for placement of temperature sensors). In the exemplary embodiment of FIG. 3, temperature sensors may be located at different locations with respect to the edges of the sensor along the x and y axes. This allows the temperature sensor to identify thermal gradients due to heat sources applied proximate to the edges, based on different sensed temperature values at different distances from the heat source. In-plane sensors may also be used to identify information about thermal gradients along the axis normal to the plane of the temperature sensors, for example, based on relative location of temperature sensors with respect to locations such as anchors that facilitate the transfer of z-axis thermal gradients.

Figure 4:
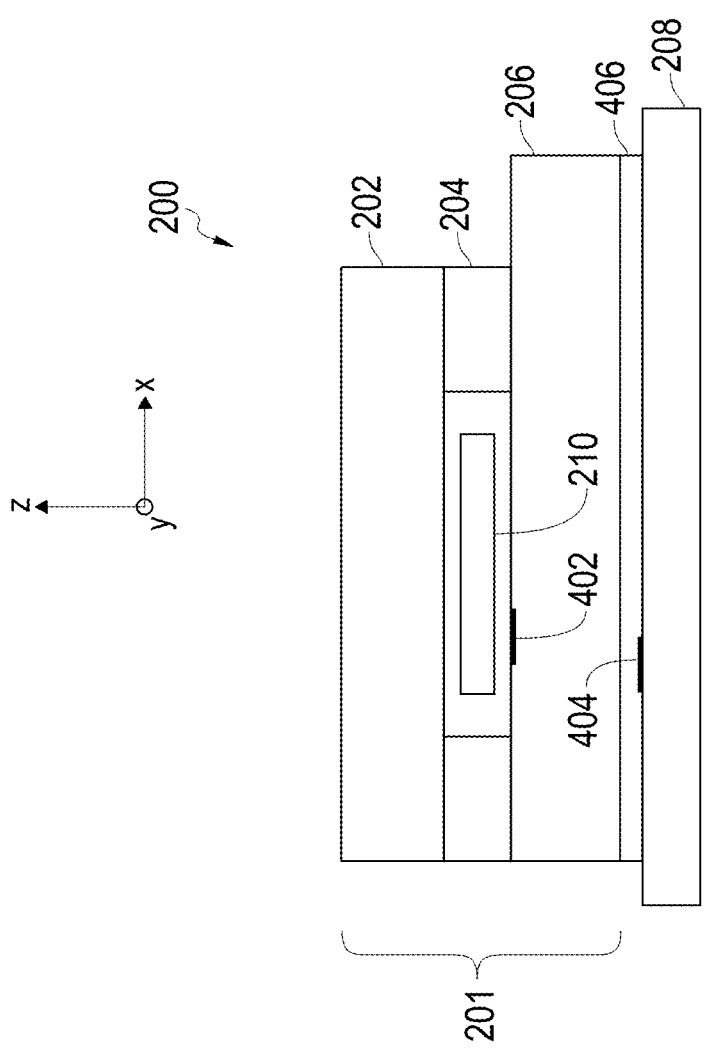
FIG. 4 depicts an exemplary MEMS package including a temperature sensor attached to a dielectric material layer in accordance with some embodiments of the present disclosure.

FIG. 4 depicts an exemplary MEMS package 200 including a temperature sensor attached to a dielectric material layer in accordance with some embodiments of the present disclosure. In the exemplary embodiment of FIG. 4, a temperature sensor 402 is located within a substrate layer 206 of MEMS device 201, while an additional temperature sensor 404 is attached to dielectric material layer 406 that couples the substrate layer 206 to the packaging layer 208. Although in the exemplary embodiment of FIG. 4 the temperature sensor 404 is depicted as attached to a lower surface of dielectric material layer 406 (e.g., that may be bonded or otherwise attached to packaging layer 208), temperature sensors may attach to other locations on or within a dielectric material layer 406, such as on an opposite (upper) surface of the dielectric material layer 406 (e.g., that may be bonded or otherwise attached to the substrate layer 208) or on one or more planes within the dielectric material layer 406.

Exemplary materials for the dielectric material layer 406 may include silicon dioxide, silicon nitride, an organic polymer, or a silicon-based polymer. A variety of temperature-sensing materials and/or components may be patterned on or within the dielectric material layer 406, such as a resistive temperature detector (RTD), thermistor, or thermocouple. Exemplary RTD materials include platinum, nickel, and other conductors. Exemplary thermocouple materials and configurations are described in U.S. patent application Ser. No. 16/531,990, entitled "Sensing Thermal Gradients Within a Microelectromechanical Device," filed Aug. 5, 2019, which is incorporated by reference herein in its entirety. A temperature sensing circuit, such as a CMOS temperature sensor, may be attached to or embedded in a packaging layer 208 or other portion of the MEMS package 200.

Each of the temperature sensors 402 and 404 may output a signal that corresponds to the temperature at the respective temperature sensor location. These output signals may be processed together (e.g., by processing circuitry as described herein) in order to determine information about thermal gradients within the MEMS device. In the exemplary embodiment of FIG. 4, the respective locations of the temperature sensors allow for direct measurement of z-axis thermal gradient within the substrate layer 206, based on the respective locations of temperature sensors 402 and 404. Although only temperature sensors 402 and 404 are depicted herein, multiple additional sensors may be located within the x-y planes of temperature sensors 402 and 404, for example, to identify x-axis and y-axis thermal gradients and/or to provide localized measurement of z-axis thermal gradients. In an embodiment, a grid of temperature sensors may provide comprehensive data for the thermal gradients within the MEMS device. In addition, the output information from temperature sensors 402 and 404 may also be combined with other information about the MEMS device (e.g., operating conditions, etc.) and/or information from external devices such as additional temperature information or data about heat sources.

Figure 5:
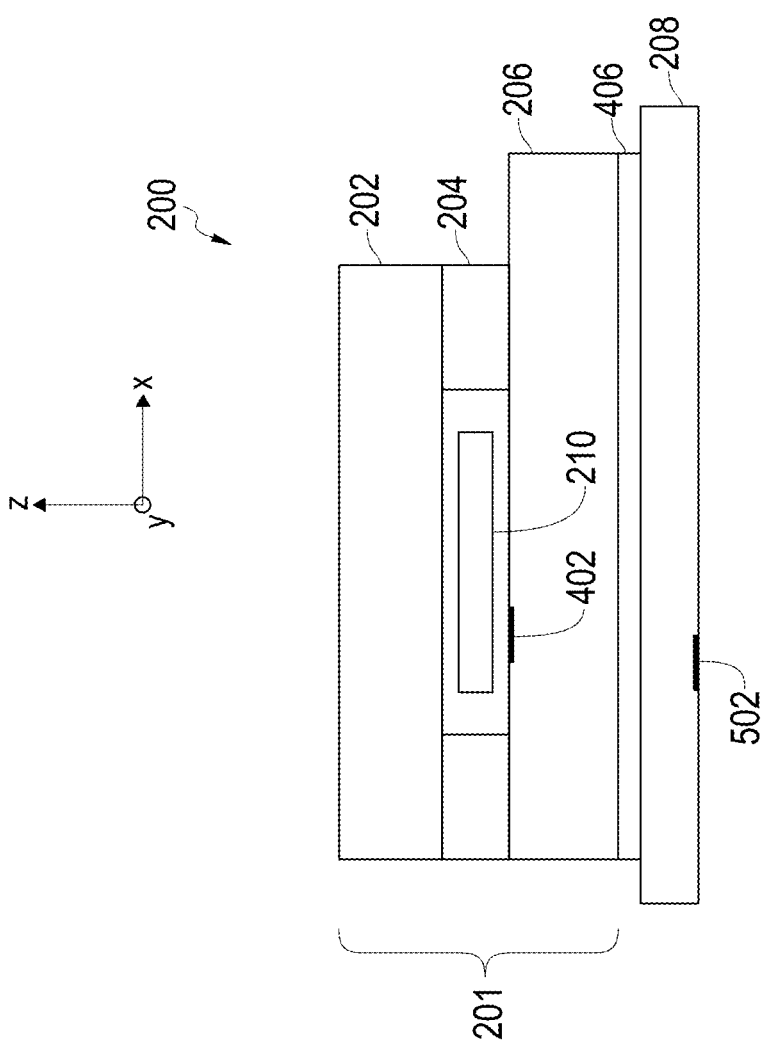
FIG. 5 depicts an exemplary MEMS package including temperature sensors attached to a packaging layer in accordance with some embodiments of the present disclosure.

FIG. 5 depicts an exemplary MEMS package 200 including a temperature sensor attached to a packaging layer in accordance with some embodiments of the present disclosure. In the exemplary embodiment of FIG. 4, a temperature sensor 402 is located within a substrate layer 206 of MEMS device 201, while an additional temperature sensor 502 is patterned within a portion of packaging layer 208. Although in the exemplary embodiment of FIG. 5 the temperature sensor 504 is depicted as patterned within a lower portion of packaging layer 208, temperature sensors may attach to other locations on or within packaging layer 208, such as on an upper or lower surface of the packaging layer 208 or on one or more planes within the packaging layer 208.

A variety of temperature-sensing materials and/or components may be patterned on or within the packaging layer 208, such as a resistive temperature detector (RTD), thermistor, or thermocouple. A temperature sensing circuit, such as a CMOS temperature sensor, may be attached to or embedded in the packaging layer 208 or other portion of the MEMS package 200.

Each of the temperature sensors 402 and 502 may output a signal that corresponds to the temperature at the respective temperature sensor location. These output signals may be processed together (e.g., by processing circuitry as described herein) in order to determine information about thermal gradients within the MEMS device. In the exemplary embodiment of FIG. 5, the respective locations of the temperature sensors allow for direct measurement of z-axis thermal gradient between the bottom of the packaging layer 208 and the top surface of the substrate layer 206, based on the respective locations of temperature sensors 402 and 502. Although only temperature sensors 402 and 502 are depicted herein, multiple additional sensors may be located within the x-y planes of temperature sensors 402 and 502, for example, to identify x-axis and y-axis thermal gradients and/or to provide localized measurement of z-axis thermal gradients. Temperature sensors may also be located within other layers of the MEMS device or planes within layers of the MEMS device, as described herein. In an embodiment, a grid of temperature sensors may provide comprehensive data for the thermal gradients within the MEMS package (i.e., including the packaging layer 208). In addition, the output information from temperature sensors 402 and 502 may also be combined with other information about the MEMS device (e.g., operating conditions, etc.) and/or information from external devices such as additional temperature information or data about heat sources.

Figure 6:
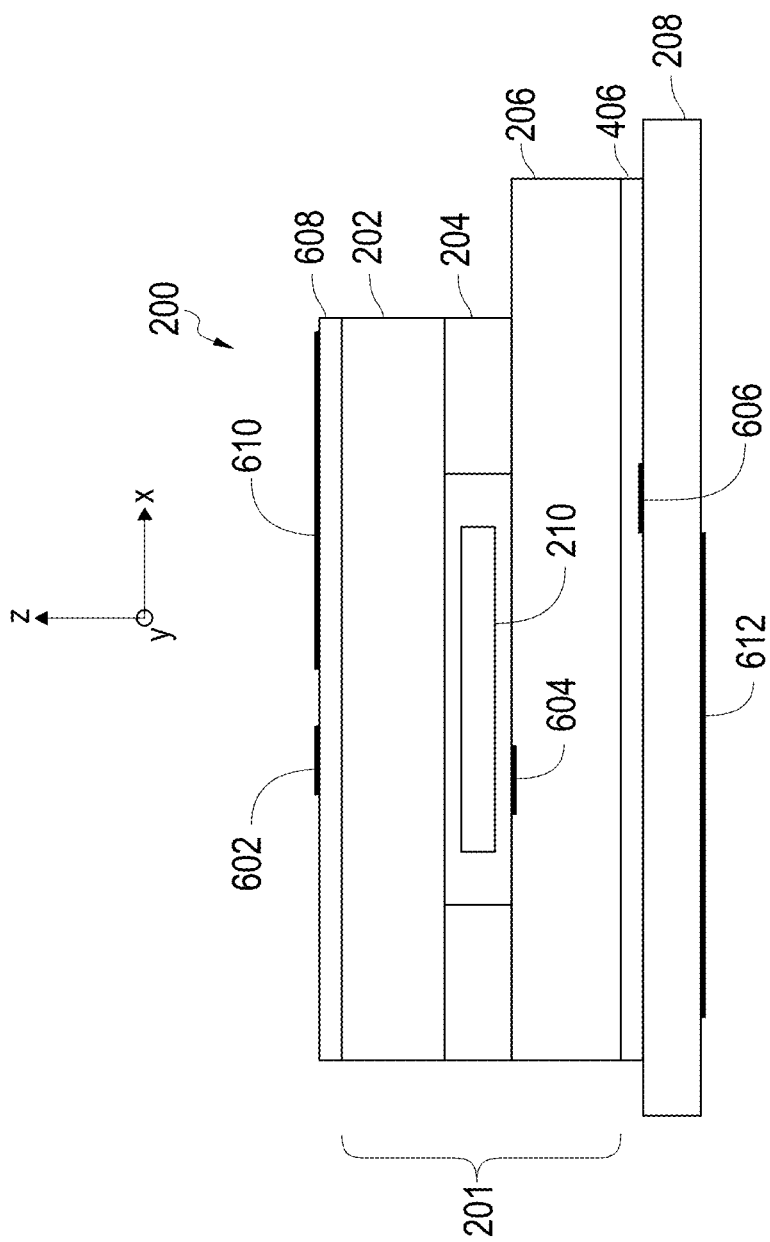
FIG. 6 depicts an exemplary MEMS package including two temperature sensors attached to two dielectric material layers in accordance with some embodiments of the present disclosure.

FIG. 6 depicts an exemplary MEMS package including two temperature sensors attached to two dielectric material layers in accordance with some embodiments of the present disclosure. In the exemplary embodiment of FIG. 6, in addition to dielectric material layer 406 attached between substrate layer 206 and packaging layer 208, a second dielectric material layer 608 is attached to the cap layer 202. Each of the dielectric material layers 406 and 608 has a respective temperature sensor 606 and 602 attached thereto. A temperature sensor 604 is also located within substrate 206. The locations of the temperature sensors 602, 604, and 606 may facilitate the measurement of temperature information of interest, such as z-axis temperature gradients between different layers of the MEMS device 201. Additional sensors may be added and locations may be varied as described herein to measure additional thermal gradient information. In the exemplary embodiment of FIG. 6, dielectric material layer 608 and packaging layer 208 are attached to respective electrostatic shield layers 610 and 612. Electrostatic shield layers 610 and 612 may be located and patterned in a manner that limits electromagnetic interference with the MEMS device 201 and temperature sensors 602, 604 and 606 from other electronic components or systems. In some embodiments, the electrostatic shield layers 610 and 612 may be a heat conducting material (e.g., copper) that distributes heat across the MEMS device 201.

Figure 7:
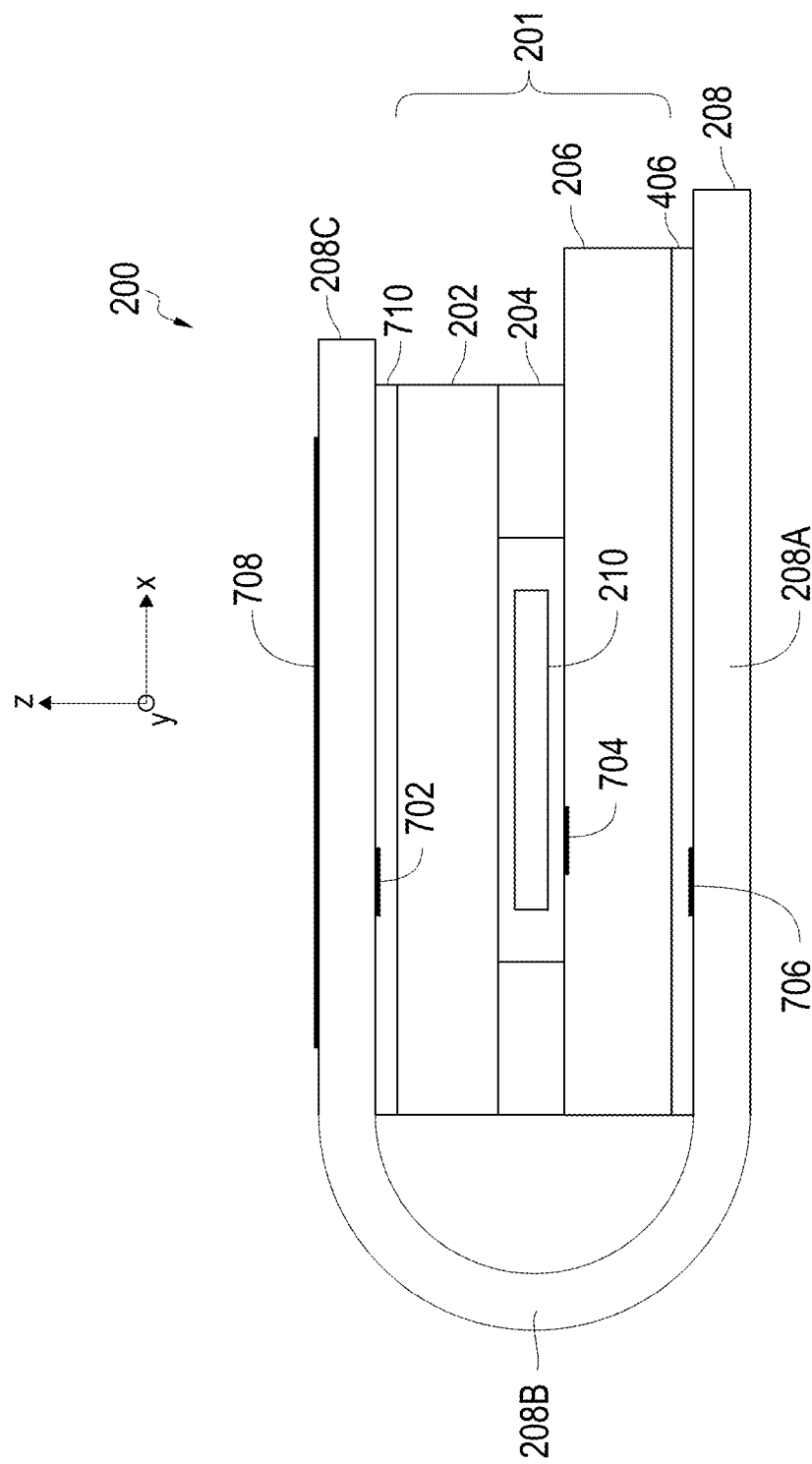
FIG. 7 depicts an exemplary MEMS package including a folded packaging layer and temperature sensors attached to a MEMS device and to multiple layers of dielectric material in accordance with some embodiments of the present disclosure.

FIG. 7 depicts an exemplary MEMS package including a folded packaging layer in accordance with some embodiments of the present disclosure. In the exemplary embodiment of FIG. 7, the packaging layer 208 may be "folded" such that it is attached (e.g., by bonding or other suitable techniques) to the MEMS device 201, via dielectric material layers at multiple locations, such as a bottom surface of substrate layer 206 via dielectric material layer 406, and a top surface of cap layer 202 via dielectric material layer 710. A first portion 208A of the packaging layer 208 may be attached to dielectric material layer 406, a second portion 208B of the packaging layer 208 may extend around and over the MEMS device 201, and a third portion 208C of the packaging layer 208 may be attached to dielectric material layer 710. Temperature sensors 702 and 706 are located on or within the dielectric material layers, but at different locations to facilitate particular thermal gradient measurements. As depicted in FIG. 7, temperature sensors 702 and 706 may be located such that the entire z-axis height of the MEMS device 201 is located between temperature sensors 702 and 706. An additional temperature sensor 704 may be located within a layer of the MEMS device 201, such as substrate layer 206.

Each of the temperature sensors 702, 704, and 706 may output a signal that corresponds to the temperature at the respective temperature sensor location. These output signals may be processed together (e.g., by processing circuitry as described herein) in order to determine information about thermal gradients within the MEMS device. In the exemplary embodiment of FIG. 7, the respective locations of the temperature sensors allows for direct measurement of z-axis thermal gradient between the bottom of the substrate layer 206 to the top of the cap layer 202, based on the respective locations of temperature sensors 702 and 706, as well as between these layers and a plane of the substrate layer 206 based on temperature sensor 704. Although only temperature sensors 702, 704, and 706 are depicted herein, multiple additional sensors may be located within the x-y planes of temperature sensors 702, 704, and 706, for example, to identify x-axis and y-axis thermal gradients and/or to provide localized measurement of z-axis thermal gradients. Temperature sensors may also be located within other layers of the MEMS device or planes within layers of the MEMS device, as described herein. In an embodiment, a grid of temperature sensors may provide comprehensive data for the thermal gradients within the MEMS device. In addition, the output information from temperature sensors 702, 704, and 706 may also be combined with other information about the MEMS device (e.g., operating conditions, etc.) and/or information from external devices such as additional temperature information or data about heat sources.

In some embodiments of the present disclosure, dielectric material layers 406 and 710 and/or packaging layer 208 may also facilitate the addition of other components, such as an electrostatic shield layer 708. An electrostatic shield layer 708 may be located and patterned in a manner that limits electromagnetic interference with the MEMS device 201 and temperature sensor 702 from other electronic components or systems. In some embodiments, the electrostatic shield layer 708 may be a heat conducting material (e.g., copper) that facilitates heat conduction within and between packaging layer portions 208A and 208C and reduces temperature gradients across the MEMS device 201. Although the electrostatic shield layer 708 is described as heat conducting in an embodiment, heat conduction may be performed at a variety of locations on the dielectric material layer and with a variety of materials, without regard to whether electrostatic shielding occurs (e.g., based on respective heat transfer coefficients).

Figure 8:
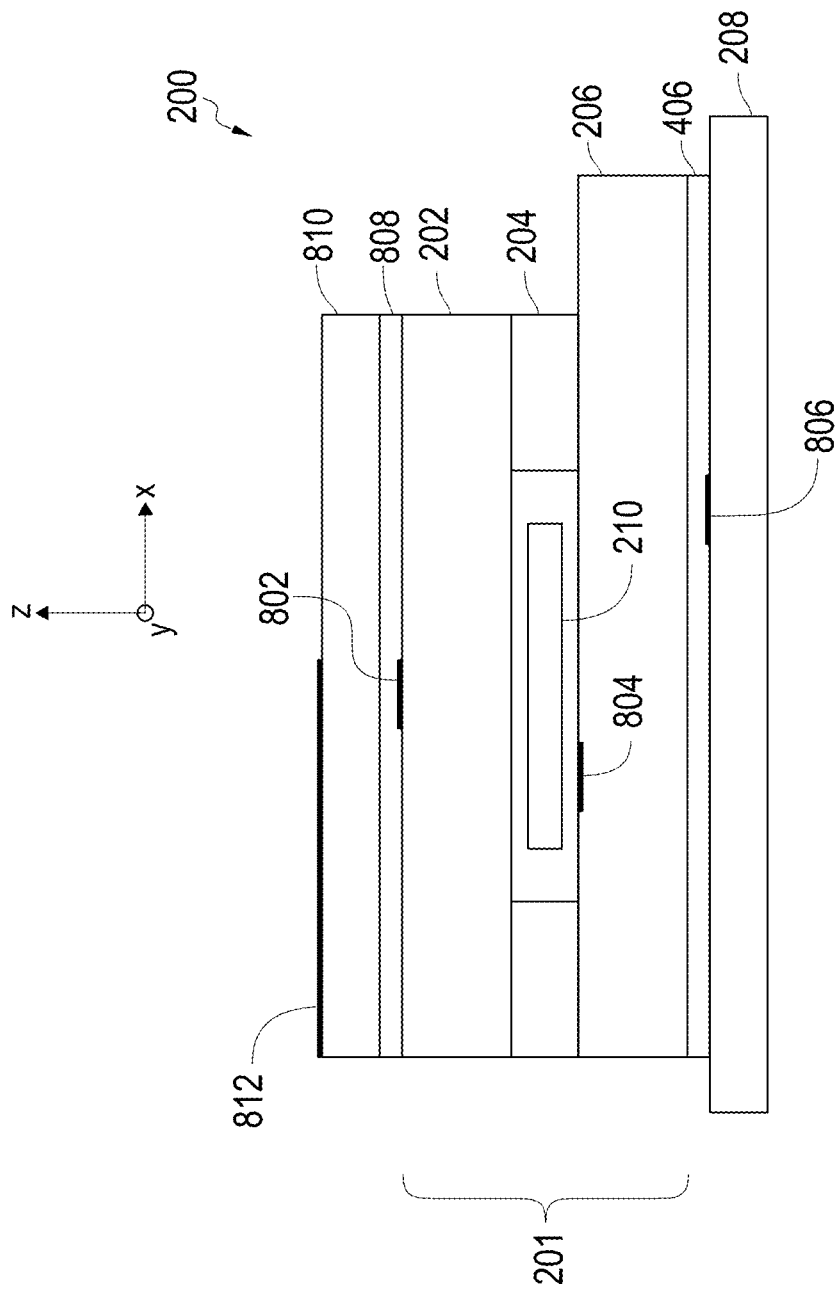
FIG. 8 depicts an exemplary MEMS package including multiple dielectric material layers, multiple packaging layers, and multiple temperature sensors in accordance with some embodiments of the present disclosure.

FIG. 8 depicts an exemplary MEMS package including multiple dielectric material layers and multiple packaging layers in accordance with some embodiments of the present disclosure. In the exemplary embodiment of FIG. 8, a dielectric material layer 406 is located between substrate layer 206 and packaging layer 208, and a dielectric material layer 808 is located between cap layer 202 and packaging layer 810. Temperature sensors 802 and 806 are located on or within the dielectric material layers, but at different locations to facilitate particular thermal gradient measurements. As depicted in FIG. 8, temperature sensors 802 and 806 may be located such that the entire z-axis height of the MEMS device 201 is located between temperature sensors 802 and 806. An additional temperature sensor 804 may be located within a layer of the MEMS device 201, such as substrate layer 206.

Each of the temperature sensors 802, 804, and 806 may output a signal that corresponds to the temperature at the respective temperature sensor location. These output signals may be processed together (e.g., by processing circuitry as described herein) in order to determine information about thermal gradients within the MEMS device. In the exemplary embodiment of FIG. 8, the respective locations of the temperature sensors allow for direct measurement of z-axis thermal gradient between the bottom of the substrate layer 206 and the top of the cap layer 202, based on the respective locations of temperature sensors 802 and 806, as well as between these layers and a plane of the substrate layer 206 based on temperature sensor 804. Although only temperature sensors 802, 804, and 806 are depicted herein, multiple additional sensors may be located within the x-y planes of temperature sensors 802, 804, and 806, for example, to identify x-axis and y-axis thermal gradients and/or to provide localized measurement of z-axis thermal gradients. Temperature sensors may also be located within other layers of the MEMS device or planes within layers of the MEMS device, as described herein. In an embodiment, a grid of temperature sensors may provide comprehensive data for the thermal gradients within the MEMS package (i.e., including the packaging layer 208). In addition, the output information from temperature sensors 802, 804, and 806 may also be combined with other information about the MEMS device (e.g., operating conditions, etc.) and/or information from external devices such as additional temperature information or data about heat sources.

In some embodiments of the present disclosure, packaging layers 208 and 810 may also facilitate the addition of other components, such as an electrostatic shield layer 812. An electrostatic shield layer 812 may be located and patterned in a manner that limits electromagnetic interference with the MEMS device 201 and temperature sensor 802 from other electronic components or systems. In some embodiments, the electrostatic shield layer 812 may be a heat conducting material (e.g., copper) that distributes heat across the MEMS device 201. Although the electrostatic shield layer 812 is described as heat conducting in an embodiment, heat conduction may be performed at a variety of locations on the dielectric material layer and with a variety of materials, without regard to whether electrostatic shielding occurs (e.g., based on respective heat transfer coefficients).

Figure 9:
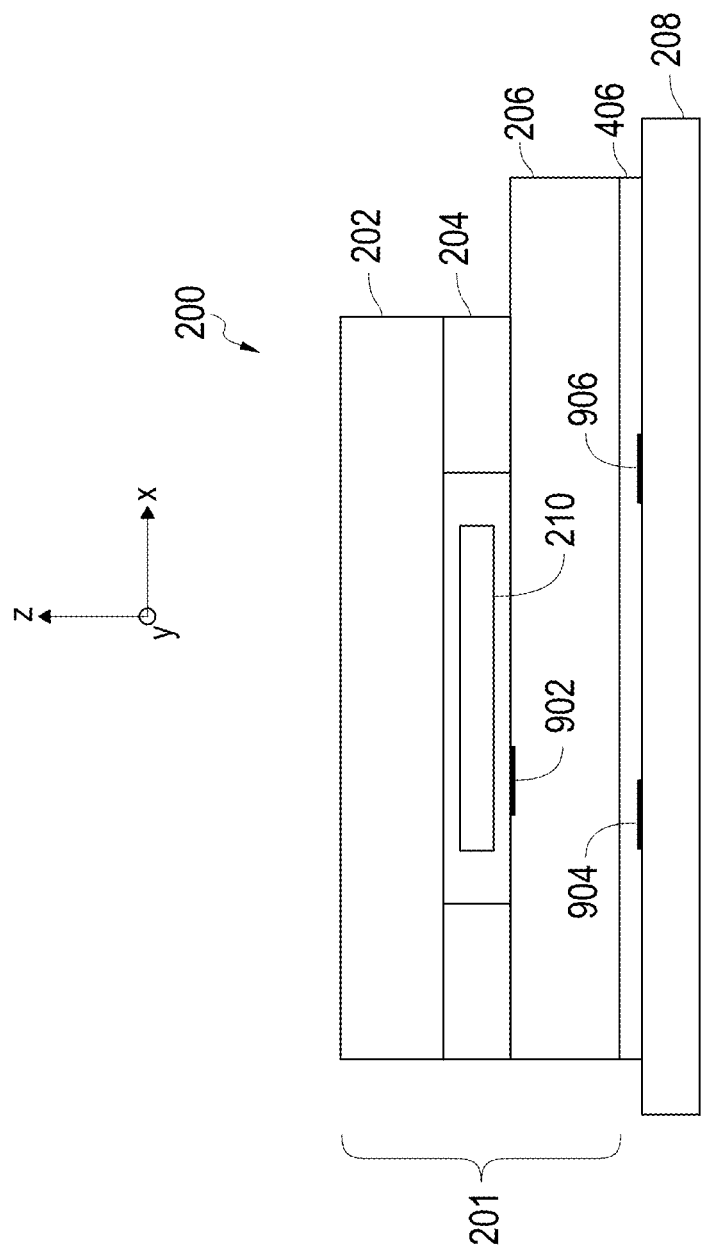
FIG. 9 depicts an exemplary MEMS package including two temperature sensors attached to a dielectric material layer in accordance with some embodiments of the present disclosure.

FIG. 9 depicts an exemplary MEMS package including two temperature sensors attached to a dielectric material layer in accordance with some embodiments of the present disclosure. In the embodiment of FIG. 9, two temperature sensors 904 and 906 are depicted as being attached to a single dielectric material layer 406. A temperature sensor 902 is also located within substrate 206. The locations of the temperature sensors 902, 904, and 906 may facilitate the measurement of temperature information of interest, such as z-axis temperature gradients within the substrate layer 206 of the MEMS device 201 (e.g., based on the z-axis distance between temperature sensors 904/906 and temperature sensor 902) as well as x-axis and y-axis temperature gradients (e.g., based on relative x-y plane locations of the temperature sensors). Additional sensors may be added and locations may be varied as described herein to measure additional thermal gradient information, and in some embodiments, heat conducting material layers may be added to packaging layer 208 or layers of MEMS device 201 (not depicted in FIG. 9).

Figure 10:
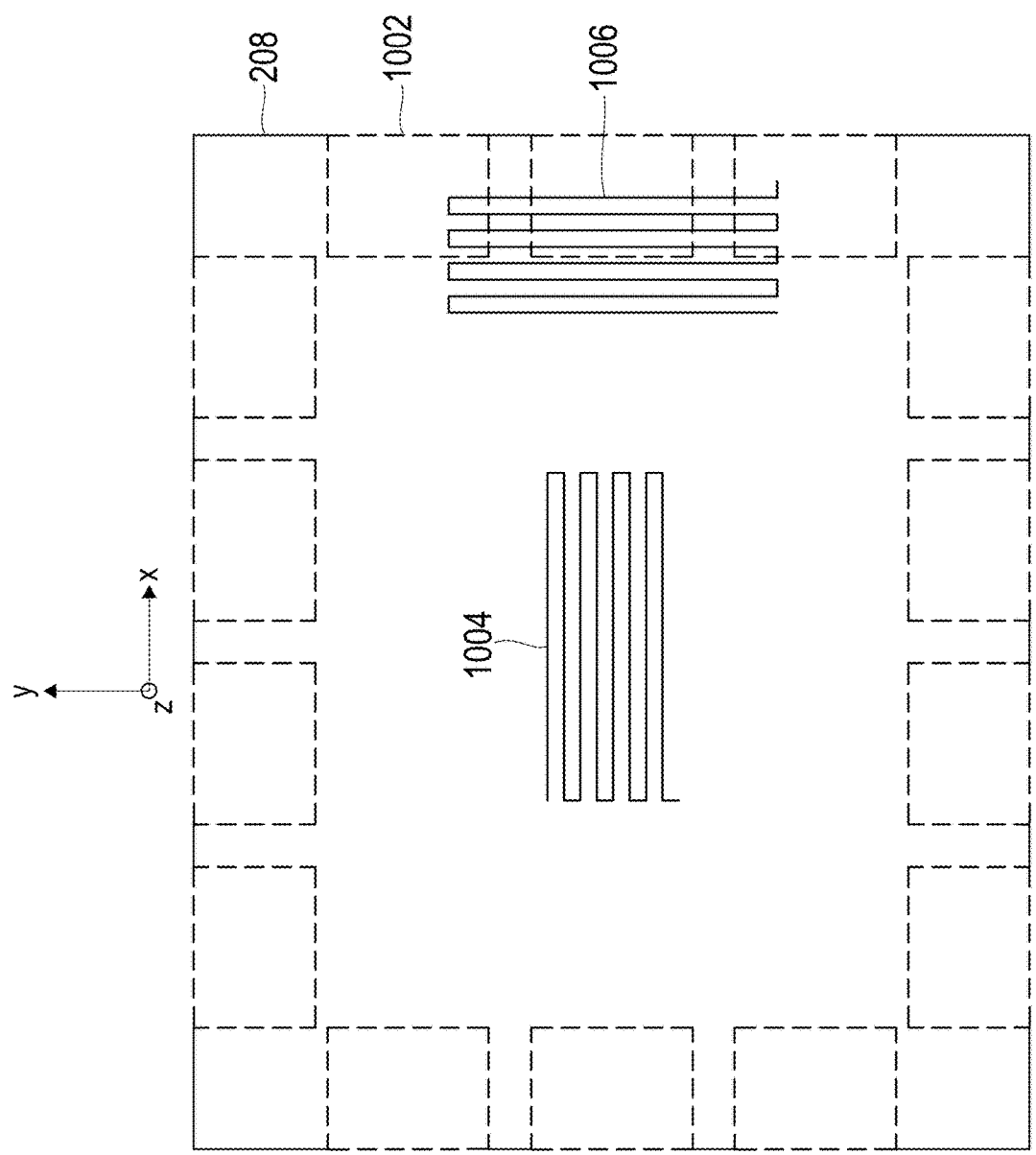
FIG. 10 depicts an exemplary top view of locations of temperature sensors with respect to a packaging layer in accordance with some embodiments of the present disclosure.

FIG. 10 depicts an exemplary top view of locations of temperature sensors with respect to a packaging layer in accordance with some embodiments of the present disclosure. In the exemplary embodiment of FIG. 10, the temperature sensors 1004 and 1006 are patterned on a lower surface of dielectric material layer 406 (not depicted) above packaging layer 208, opposite bond pads 1002 that attach the packaging layer 208 to other components of the end-use system or device that the MEMS package 200 is operating within. As described herein, it will be understood that the bond pads 1002 transfer heat between the packaging layer and other components, that attachment of temperature sensors to the dielectric material layer 406 may be at other locations on or within the dielectric material layer 406, and/or that temperature sensors may be formed on or within the packaging layer 208. Further, the particular x-y plane location, size, layout, number, and configuration of temperature sensors 1004 and 1006 is exemplary only, and it will be understood that these parameters may be modified in accordance with the present disclosure.

In the exemplary embodiment of FIG. 10, each of temperature sensors 1004 and 1006 comprises an RTD temperature sensor, with the material, shape, location, and thickness of the RTD material selected to provide a suitable power consumption, range of temperature measurement, signal amplitude, accuracy, and linearity that correspond to the operating conditions of the MEMS device 201. For example, as depicted in FIG. 10, RTD traces may be folded in close proximity in a region of interest for temperature measurement, although other configurations and patterns may be used in other embodiments, such as a spiral. Other sensor types (e.g., semiconductor-based, thermocouples, thermistors) may be utilized in other embodiments, or in some embodiments multiple different sensor types may be used on a single MEMS package, for example, to enable different response characteristics (e.g., response time, accuracy, etc.).

Returning to FIG. 1, the outputs of the temperature sensors may be provided to processing circuitry 14 for additional processing. The temperature sensor outputs may be provided to the processing circuitry by any suitable form of transmission, such as via wirebonds, vias, or other suitable electrical transmission paths. In some embodiments, some or all of the processing circuitry utilized to initially process the temperature sensor outputs may be included within the MEMS device 12/201, while in some embodiments some or all of the processing may be performed by external circuitry such as a microprocessor that receives data via a wired or wireless data path. In the exemplary embodiment of FIGS. 2-9, the processing circuitry may be included in a CMOS substrate layer 206, with temperature sensor outputs from sensors within the CMOS substrate layer 206 processed via internal electrical connections (not depicted) and other temperature sensors outputs provided to the processing circuitry via electrical connections such wire bonds to the CMOS substrate layer 206 (not depicted).

The temperature sensor outputs may be analyzed by the processing circuitry to identify thermal gradients of interest. As described herein, the absolute values of temperature sensor outputs, differences between temperature sensor outputs, and rate of change of temperature sensor outputs may provide detailed information about the location of the heat source (e.g., applied at which layer of the MEMS device, applied at which side of the MEMS device, and extent of overlap between the heat source and the MEMS device), the intensity of the heat source (e.g., based on relative temperature sensor outputs, rate of change of outputs proximate the heat source, etc.), and pattern of application (e.g., heat sources applied in a periodic manner, as pulses, or in other patterns, versus heat sources that have minimal variation). In some embodiments, respective temperature sensor outputs (e.g., along axes within an x-y plane to identify lateral thermal gradients, at different depths/planes to identify vertical and/or lateral thermal gradients, or at relative locations with respect to particular components for rejecting certain thermal gradients while measuring other thermal gradients) may be coupled as bridges including any suitable number of elements and configurations such as: a Wheatstone bridge, half-bridge (divider) (e.g., with temperature sensors as one or more of the resistances), series voltage, or current sum or difference configuration such that relative differences in temperature sensor outputs may be quickly determined by a single output value. In some embodiments, respective temperature sensor outputs may be connected to a single sensing circuit in a multiplexed fashion. In some embodiments, different subsets of temperature sensors may be of different types, for example, having different accuracy or response time.

In some embodiments, the processing circuitry may also receive additional external data relating to heat sources. For example, the processing circuitry may be in communication with other circuitry such as external processors, batteries, displays, transponders, power-management circuits, or other temperature measurement circuitry of the end-use device in which the MEMS device is incorporated. Information about the operation of these components may be provided to the processing circuitry. In some embodiments, such information may be correlated with temperature sensor measurements of the MEMS device to identify patterns of heat transfer from other components and systems of the end-use device. This information may be used to proactively perform compensation such as by modifying the operation of the MEMS device prior to thermal energy from the heat source actually affecting the output of the MEMS device. Information from the MEMS device may also be provided to the other components and systems of the MEMS device, for example, to better identify patterns of heat transfer within the end-use device and modify operations of the end-use device as appropriate (e.g., modifying operating voltages, processing loads, entering low power or sleep modes, etc.).

Once temperature sensor outputs and other related values (e.g., combined outputs based on bridge circuits, etc.) have been received, the processing circuitry may respond to the measured temperature information. One exemplary response may be to compensate for thermal gradients by adding a compensation term to MEMS device outputs, e.g. an offset compensation. Calibration testing, which may be performed during manufacturing or in the field, may determine changes in MEMS device outputs based on different thermal gradients (e.g., location, degree, pattern). This information may be stored (e.g., in a lookup table stored at the MEMS device) such that values may be modified to maintain correct output values (e.g., linear acceleration, angular velocity, pressure, magnetic field, etc.) in the presence of thermal gradients. Another exemplary response may be to modify the operation of the MEMS device. Applied signals, such as signals that cause movement of MEMS components (e.g., a drive signal of a MEMS gyroscope), may be modified based on known temperature effects (e.g., increasing or inhibiting movement of components of a suspended spring-mass system) determined, for example, based on a calibration routine. Output signals (e.g., a sense signal of a MEMS accelerometer or pressure sensor) may likewise be modified based on known temperature effects. Another exemplary response may be to modify the operation of the MEMS device as a whole, for example, by placing the sensor in a temporary sleep mode, modifying parameters of a power source for the MEMS device, or otherwise changing the overall usage of the MEMS device. Another exemplary response may be to activate a heat source in the MEMS device to counteract the effect of the externally applied temperature gradient by applying a force to the MEMS proof mass.

Figure 11:
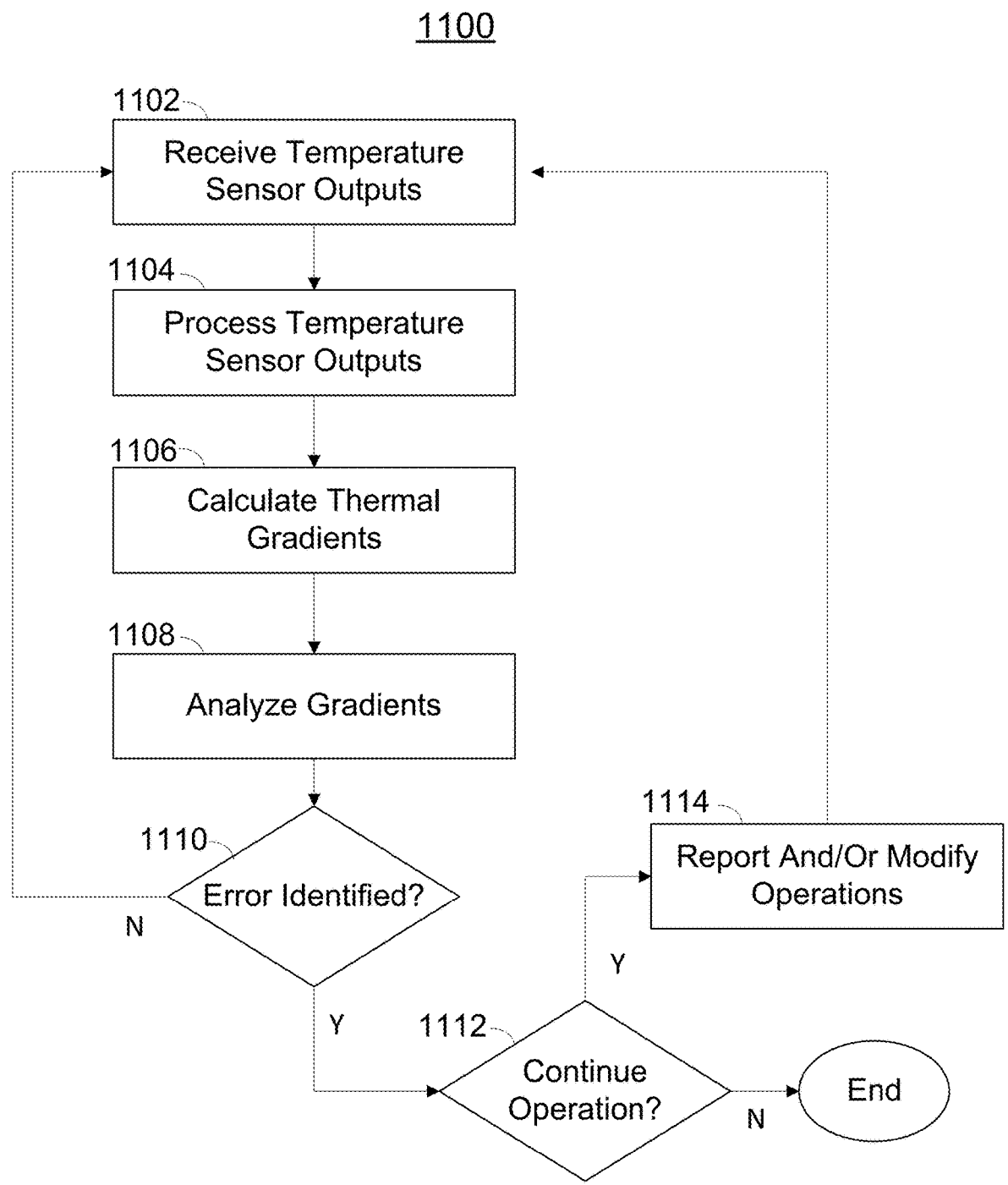
FIG. 11 depicts exemplary steps for processing received temperature sensor outputs in accordance with some embodiments of the present disclosure.

FIG. 11 depicts exemplary steps for processing received temperature sensor outputs in accordance with some embodiments of the present disclosure. Although FIG. 11 is described in the context of the present disclosure, it will be understood that the methods and steps described in FIG. 11 may be applied to a variety of MEMS device designs, temperatures sensor types, processing circuitry, and compensation techniques. Although a particular order and flow of steps is depicted in FIG. 11, it will be understood that in some embodiments one or more of the steps may be modified, moved, removed, or added, and that the flow depicted in FIG. 11 may be modified.

At step 1102, temperature sensor outputs may be received (e.g., by processing circuitry of the MEMS device) from temperature sensors located on and/or within one or more layers of the MEMS package. The temperature sensor outputs may be received over time, such that patterns and changes in temperature may be identified. In some embodiments, temperature sensor outputs may be received in a combined form, e.g. a sum or difference computed by sensors connected in a divider or other suitable configuration. In some embodiments, the temperature sensor outputs may be taken at particular stages in sensor operation, such as at power up, initiation of measurements, periodically during MEMS device operation, and prior to shut down. In some embodiments (not depicted in FIG. 11), information from other devices, components and sensors may also be acquired (e.g., relating to operation of adjacent components, external temperature measurements, power consumption, etc.). Once the temperature sensor outputs are received, processing may continue to step 1104.

At step 1104, the temperature sensor outputs may be processed. Temperature sensor outputs may be processed individually, for example, with filters to remove noise from temperature sensor outputs, amplifiers, A/D converters, and other suitable components to provide appropriate scaling for further analysis. Once the temperature sensor outputs are processed for further analysis, processing may continue to step 1106.

At step 1106, thermal gradients may be calculated based on the received values. As described herein, by having multiple temperature sensors at particular locations with respect to heat sources and, in some embodiments, at different layers or depths within layers of the MEMS package, absolute temperatures at particular locations or temperature differences between different locations may be identified. Rates of change of thermal gradients may also be determined based on thermal gradient information over time. Once the thermal gradients have been calculated, processing may continue to step 1108.

At step 1108, the thermal gradients may analyzed to determine whether some form of action should be taken. In some embodiments, tolerances may be associated with absolute temperature at particular locations, number of temperature sensors identifying an absolute temperature above threshold values, temperature differences between particular temperature sensor locations, number of temperature differences exceeding threshold values, and rate of change of absolute temperatures values and/or temperature difference values, e.g. 0.1 kelvin. In some embodiments, a heat source may be identified based on the thermal gradient information, for example, by identifying a location of the heat source and a pattern of application. This heat source identification may be compared to known heat source locations and patterns, as well as data received from other sources (e.g., external temperature sensor data or information about operation of other components or devices). Once the thermal gradients are analyzed, processing may continue to step 1110.

At step 1110, it may be determined (e.g., by processing circuitry) whether an error that requires additional action has been identified. If no additional action is required, processing may return to step 1102 to receive additional temperature sensor outputs. If additional action is required, the additional action may be identified based on the type and severity of error that is identified. Processing may then continue to step 1112.

At step 1112, it may be determined whether the MEMS device may continue operation in spite of the error. In some embodiments, thermal gradients that indicate errors but with characteristics (e.g., absolute temperature, temperature difference, rate of change) that fall below certain thresholds may require only notifications or modifications to operation of the MEMS device, while more severe errors may require partial or complete shutdown of the MEMS device. If the MEMS device may continue operation, processing may continue to step 1114. If the MEMS device may not continue operation, processing may end.

At step 1114, action may be taken to modify the output of the MEMS device. Such modification may include addition of additive compensating terms or modification of scaling factors, or activating a heat source in the MEMS device.

Also at step 1114, notifications may be provided. Notifications may be internal to the MEMS device and/or may be provided to external components and devices, and may provide information about the nature and severity of the error, and any corrective action taken by the MEMS device or to be taken by other components and devices (e.g., modifying an accuracy of the output of the MEMS device). Modifications to the operation of the MEMS device may include a variety of modifications as described herein, such as modification of scaling factors, addition of compensation values, changes to calculation of measured parameters, and modification of operating parameters of the MEMS device (e.g., drive voltages, sense voltages, etc.). Once notifications have been provided and/or operations of the sensor have been modified, processing may return to step 1102 to receive additional temperature sensor outputs.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A system for identifying a thermal gradient within a device, comprising:
   a microelectromechanical (MEMS) device, comprising:
   a plurality of layers;
   a cavity within the plurality of layers, wherein one or more microelectromechanical components are movable within the cavity in response to an external force;
   a planar surface of the MEMS device;
   a dielectric material layer coupled to the planar surface;
   a plurality of temperature sensors, at least one of which is attached to the dielectric material layer;

processing circuitry configured to receive a signal from the plurality of temperature sensors and output a response signal representative of the thermal gradient along an axis that is normal to the planar surface of the MEMS device, wherein the response signal is proportional to a difference between the signals from the plurality of temperature sensors.

2. The system of claim 1, wherein the dielectric material layer comprises a plurality of layers, including dielectric layers and patterned conducting layers.

3. The system of claim 1, wherein the processing circuitry is further configured to determine a value based on a movement of the one or more microelectromechanical components in response to the external force and modify the value based on the thermal gradient.

4. The system of claim 2, wherein the external force comprises linear acceleration, angular velocity, magnetic field, acoustic pressure, or barometric pressure.

5. The system of claim 2, wherein, to modify the value, the processing circuitry is configured to compute an additive compensation term and add it to the value.

6. The system of claim 2, wherein, to modify the value, the processing circuitry is configured to modify a scaling factor for converting the value into a measurement of the external force.

7. The system of claim 2, wherein, to modify the value, the processing circuitry is configured to access a conversion factor from a conversion table and modify the value based on the conversion factor, wherein the conversion table associates each of a plurality of thermal gradients with a respective conversion factor and wherein each respective conversion factor corresponds to a change in the external force due to the thermal gradient.

8. The system of claim 1, wherein, to calculate the thermal gradient, the processing circuitry is configured to reject a lateral thermal gradient within the planar surface.

9. The system of claim 1, wherein the plurality of temperature sensors is coupled in a divider or half-bridge configuration.

10. The system of claim 1, wherein the plurality of temperature sensors comprises four temperature sensors and is coupled in a Wheatstone bridge configuration.

11. The system of claim 1, wherein the system further comprises:
a second planar surface of the MEMS device, opposite the first planar surface;
a second dielectric material layer coupled to the second planar surface; and
one or more temperature sensors attached to or contained within the second dielectric material layer.

12. The system of claim 1, wherein the system further comprises a second planar surface of the MEMS device, opposite the first planar surface, further comprising:
a second dielectric material layer coupled to the second planar surface; and
a packaging layer, wherein the packaging layer is curved to couple to the both the first dielectric material layer and the second dielectric material layer.

13. The system of claim 12, wherein the second dielectric material layer comprises a portion of the dielectric material layer.

14. The system of claim 1, further comprising:
a packaging layer coupled to the dielectric material layer; and
a heat conducting material attached to the packaging layer, wherein:

a first heat transfer coefficient of the heat conducting material is greater than a second heat transfer coefficient of the packaging layer;
a first temperature sensor of the plurality of temperature sensors is located between the heat conducting material and the planar surface along the axis; and
a second temperature sensor of the plurality of sensors is not located between the heat conducting material and the planar surface along the axis.

15. The system of claim 1, wherein the at least one of the plurality of temperature sensors attached to the dielectric material layer comprises a resistive temperature detector (RTD), a thermistor or a thermocouple.

16. The system of claim 1, wherein the at least one of the plurality of temperature sensors attached to the dielectric material layer is patterned on a plane of the dielectric material layer.

17. The system of claim 1, wherein the at least one of the plurality of temperature sensors attached to the dielectric material layer is patterned within the dielectric material layer between an upper plane of the dielectric material layer and a lower plane of the dielectric material layer.

18. The system of claim 1, wherein at least one of the plurality of temperature sensors is patterned within a plurality of semiconductor dies, wherein the plurality of semiconductor dies is located between the bottom planar surface of the MEMS device and an upper plane of the dielectric material layer.

19. The system of claim 1, further comprising an additional temperature sensor located within one of the plurality of layers of the MEMS device, wherein the processing circuitry is configured to determine the thermal gradient based on the respective signals from the plurality of temperature sensors and an additional signal from the additional temperature sensor.

20. The system of claim 1, wherein the dielectric material layer is silicon dioxide, silicon nitride, an organic polymer, or a silicon-based polymer.

21. The system of claim 1, further comprising a heater configurable to supply heat based on the response signal.

22. The system of claim 1, further comprising a packaging layer, wherein at least one of the plurality of temperature sensors is attached to the packaging layer.

23. The system of claim 22, wherein a first planar surface of the packaging layer is attached to the dielectric material layer, and wherein the at least one of the plurality of temperature sensors that is attached to the packaging layer is attached to a second planar surface of the packaging layer that is located opposite the first planar surface of the packaging layer.

24. A method for identifying a thermal gradient within a system, the comprising:
receiving, at processing circuitry, a signal from a plurality of temperature sensors, wherein at least one of the plurality of temperature sensors is attached to a dielectric material layer, wherein the dielectric material layer is coupled to a top planar surface of a microelectromechanical (MEMS) device or a bottom planar surface of the MEMS device;
determining, by the processing circuitry, a thermal gradient along an axis that is normal to the top planar surface and the bottom planar surface based on a respective signal from each of the plurality of temperature sensors;
determining, by the processing circuitry, a value based on a movement of one or more microelectromechanical components of the MEMS device in response to an external force that causes movement of the microelectromechanical components; and modifying, by the processing circuitry, the value based on the thermal gradient.

25. A packaged microelectromechanical (MEMS) device, comprising:
   a MEMS device, comprising:
   a plurality of layers;
   a cavity within the plurality of layers, wherein one or more microelectromechanical components are movable within the cavity in response to an external force;
   a planar surface of the MEMS device;
   a dielectric material layer coupled to the planar surface;
   a plurality of temperature sensors, at least one of which is attached to the dielectric material layer, wherein the plurality of temperature sensors comprises four temperature sensors and is coupled in a Wheatstone bridge configuration.

* * * * *